US008445301B2

(12) United States Patent
Yoon et al.

(10) Patent No.: US 8,445,301 B2
(45) Date of Patent: May 21, 2013

(54) THIN-FILM TRANSISTOR SUBSTRATE, METHOD OF MANUFACTURING THE SAME, AND DISPLAY DEVICE INCLUDING THE SAME

(75) Inventors: Kap-Soo Yoon, Seoul (KR); Woo-Geun Lee, Yongin-si (KR); Bong-Kyun Kim, Hwaseong-si (KR); Sung-Hoon Yang, Seoul (KR); Ki-Won Kim, Suwon-si (KR); Hyun-Jung Lee, Yangju-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/027,453

(22) Filed: Feb. 15, 2011

(65) Prior Publication Data

US 2011/0204370 A1  Aug. 25, 2011

(30) Foreign Application Priority Data

Feb. 19, 2010  (KR) .......................... 10-2010-0015184

(51) Int. Cl.
*H01L 21/00* (2006.01)
(52) U.S. Cl.
USPC ..................................... 438/46; 257/E21.476

(58) Field of Classification Search
USPC ....... 257/57, 59, E29.296, E33.053, E21.476; 438/46
See application file for complete search history.

(56) References Cited

U.S. PATENT DOCUMENTS

| 2002/0056838 A1* | 5/2002 | Ogawa .......................... 257/59 |
| 2008/0142797 A1* | 6/2008 | Lee et al. ......................... 257/43 |
| 2010/0133991 A1* | 6/2010 | Kim et al. .................... 313/504 |
| 2010/0210056 A1* | 8/2010 | Seo et al. ........................ 438/34 |

FOREIGN PATENT DOCUMENTS

JP   10301127 A  * 11/1998

* cited by examiner

*Primary Examiner* — William D Coleman
*Assistant Examiner* — Christine Enad
(74) *Attorney, Agent, or Firm* — F. Chau & Associates, LLC

(57) ABSTRACT

Provided are a thin-film transistor (TFT) substrate, a method of manufacturing the same, and a display device including the same. The TFT substrate includes a gate electrode formed on a substrate, a gate insulating layer formed on the gate electrode, an oxide semiconductor pattern formed on the gate insulating layer, a source electrode formed on the oxide semiconductor pattern, a drain electrode formed on the oxide semiconductor pattern to face the source electrode, and a pixel electrode formed on the gate insulating layer.

12 Claims, 14 Drawing Sheets

THIN-FILM TRANSISTOR SUBSTRATE, METHOD OF MANUFACTURING THE SAME, AND DISPLAY DEVICE INCLUDING THE SAME

CROSS-REFERENCE TO RELATED APPLICATIONS

This application claims priority from Korean Patent Application No. 10-2010-0015184, filed on Feb. 19, 1010 in the Korean intellectual Property Office, the disclosure of which is incorporated herein by reference in its entirety.

BACKGROUND OF THE INVENTION

1. Technical Field

The present invention relates to a thin-film transistor (TFT) substrate, and more particularly, to a TFT, a method of manufacturing the same, and a display device including the same.

2. Discussion of the Related Art

In liquid crystal displays (LCDs), which are one example of display devices, a plurality of wirings are formed on a thin-film transistor (TFT) substrate. Typically, photolithographic methods may be used to form these wirings. In photolithography, component materials are stacked and then patterned by a mask process. However, photolithography involves a plurality of process steps including thin film deposition, photoresist coating, mask alignment, exposure, development, etching, and stripping. Thus, photolithography increases processing time and product costs.

SUMMARY OF THE INVENTION

It is an objective of the present invention to provide a technology for forming a thin-film transistor (TFT) substrate by using a reduced number of masks.

Aspects of the present invention provide a TFT substrate manufactured by using a reduced number of masks.

Aspects of the present invention also provide a method of manufacturing a TFT substrate by using a reduced number of masks.

Aspects of the present invention also provide a display device including a TFT substrate which is manufactured by using a reduced number of masks.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a TFT substrate including a gate electrode formed on a substrate, a gate insulating layer formed on the gate electrode, an oxide semiconductor pattern formed on the gate insulating layer, a source electrode formed on the oxide semiconductor pattern, a drain electrode formed on the oxide semiconductor pattern to face the source electrode, and a pixel electrode formed on the gate insulating layer.

According to an aspect of the present invention, there is provided a method of manufacturing a TFT substrate. The method includes forming a gate electrode on a substrate, forming a gate insulating layer on the gate electrode, forming an oxide semiconductor pattern on the gate insulating layer, forming a source electrode and a drain electrode on the oxide semiconductor pattern to face each other, and forming a pixel electrode on the gate insulating layer to extend from the oxide semiconductor pattern.

According to an aspect of the present invention, there is provided a display device including a TFT substrate including a gate electrode which is formed on a substrate, a gate insulating layer which is formed on the gate electrode, an oxide semiconductor pattern which is formed on the gate insulating layer, a source electrode which is formed on the oxide semiconductor pattern, a drain electrode which is formed on the oxide semiconductor pattern and is separated from the source electrode, a pixel electrode which is formed on the gate insulating layer and extends from the oxide semiconductor pattern, and a common electrode facing the pixel electrode.

According to an aspect of the present invention, there is provided a method of manufacturing a TFT substrate. The method includes forming a gate electrode on a substrate, forming a gate insulating layer on the gate electrode, forming an oxide semiconductor pattern on the gate insulating layer, forming a source electrode and a drain electrode on the oxide semiconductor pattern facing each other, and forming a pixel electrode on the gate insulating layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF EXEMPLARY EMBODIMENTS

Figure 1:
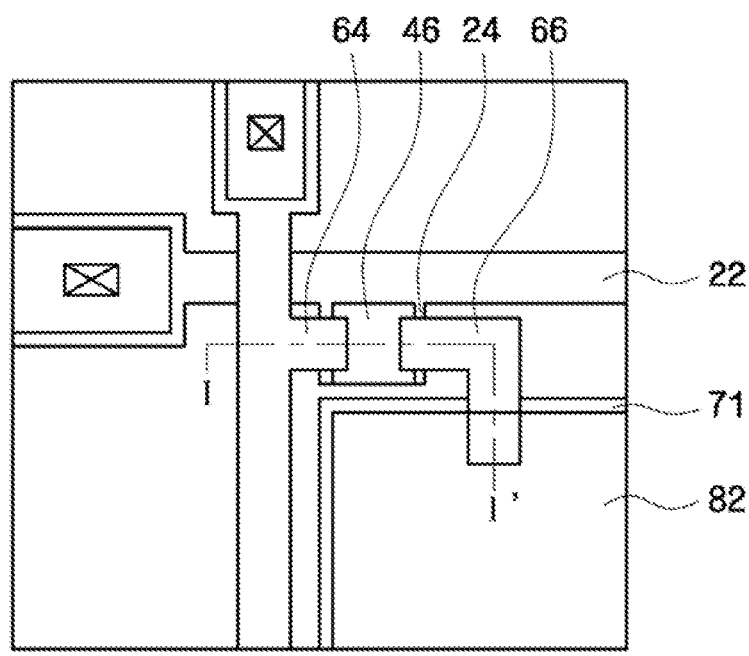
FIG. 1 is a layout view of a thin-film transistor (TFT) substrate according to an exemplary embodiment of the present invention.

Aspects and features of exemplary embodiments of the present invention may be understood more readily by reference to the accompanying drawings. The present invention may, however, be embodied in many different forms and should not be construed as being limited to the embodiments set forth herein. In the drawings, sizes and relative sizes of layers and regions may be exaggerated for clarity.

It will be understood that when an element or layer is referred to as being "on" another element or layer, the element or layer can be directly on another element or layer or intervening elements or layers. Like reference numerals may refer to like elements throughout the specification.

Hereinafter, a thin-film transistor (TFT) substrate, a method of manufacturing the TFT substrate, and a display device will be described in detail with reference to the attached drawings.

Figure 2:
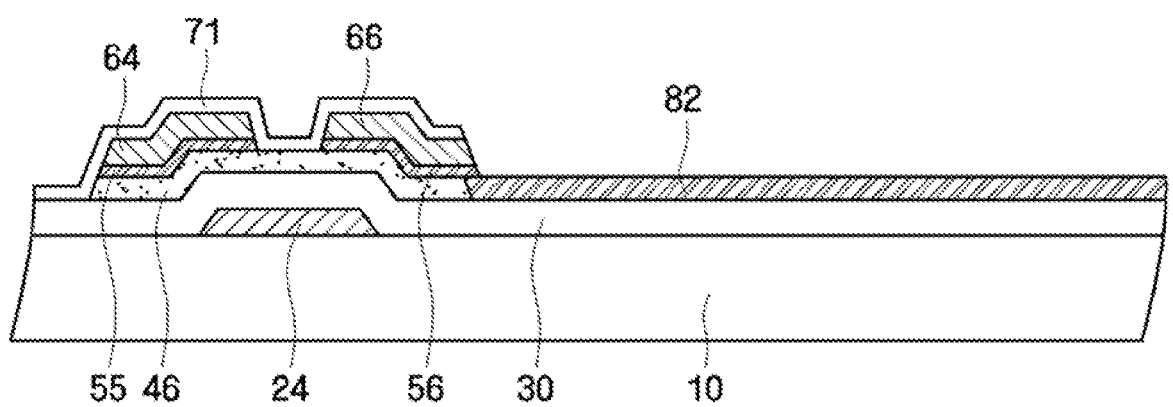
FIG. 2 is a cross-sectional view of the TFT substrate taken along the line I-I' of FIG. 1.

First, a TFT substrate according to an exemplary embodiment of the present invention is described with reference to FIGS. 1 and 2. FIG. 1 is a layout view of a TFT substrate according to an exemplary embodiment of the present invention. FIG. 2 is a cross-sectional view of the TFT substrate taken along the line I-I' of FIG. 1.

Referring to FIGS. 1 and 2, the TFT substrate according to an exemplary embodiment may include a gate wiring, a gate insulating layer 30, an oxide semiconductor pattern 46, oxide semiconductor protection film patterns 55 and 56, a data wiring, a passivation film 71, and a pixel electrode 82 which are formed on a substrate 10.

The substrate 10 may be made of a material having insulating, heat-resistant, and light-transmitting properties, such as transparent glass or plastic.

The gate wiring is formed on the substrate 10 and extended in a first direction, for example, a horizontal direction.

The gate wiring includes a gate line 22 which delivers a gate signal and a gate electrode 24 which protrudes from the gate line 22. The gate electrode 24, a source electrode 64, and a drain electrode 66, which will be described later, form three terminals of a thin-film transistor.

A storage wiring (not shown) may be formed on the substrate 10 and may be parallel to the gate wiring. For example, the storage wiring may include a storage line which extends in the first direction (e.g., the horizontal direction) and a storage electrode which branches off from the storage line and protrudes in a second direction (e.g., a vertical direction) under a data line. The second direction may be perpendicular to the first direction, for example, as is the case when the first direction is horizontal and the second direction is vertical. The storage electrode may be wider than the data line, thereby preventing leakage of light around the data line. Accordingly, the storage electrode may function as a light-blocking film. A predetermined voltage, e.g., a common voltage Vcom, is applied to the storage wiring. The storage electrode and the pixel electrode 82 overlap each other, and the gate insulating layer 30 is interposed, as a dielectric layer, between the storage electrode and the pixel electrode 82, thereby forming a storage capacitor.

Each of the gate wiring (including the gate line 22 and the gate electrode 24) and the storage wiring may be made of an aluminum (Al)-based metal such as Al or an Al alloy (e.g., Al, AlNd, AlCu, etc.), a silver (Ag)-based metal such as Ag or an Ag alloy, a copper (Cu)-based metal such as Cu or a Cu alloy, a molybdenum (Mo)-based metal such as Mo or a Mo alloy (e.g., Mo, MoN, MoNb, etc.), chromium (Cr), titanium (Ti), or tantalum (Ta).

In addition, each of the gate wiring and the storage wiring may have a multilayer structure composed of two conductive layers (not shown) with different physical characteristics. In this case, one of the two conductive layers may be made of a metal with low resistivity, such as Al-based metal, Ag-based metal or Cu-based metal, in order to reduce signal delays or voltage drops of the gate wiring and the storage wiring. On the other hand, the other one of the conductive layers may be made of a different material, in particular, a material having superior contact characteristics with indium tin oxide (ITO) and indium zinc oxide (IZO), such as Mo-based metal, Cr, Ti, or Ta. Good examples of the multilayer structure may include a combination of a Cr lower layer and an Al upper layer and a combination of an Al lower layer and a Mo upper layer. However, the present invention is not limited thereto. The gate wiring and the storage wiring may be made of various metals and conductors.

The gate insulating layer 30 is formed on the gate wiring, the storage wiring, and a portion of the insulating substrate 10 on which the gate wiring and the storage wiring are not formed. The gate insulating layer 30 may be made of an inorganic insulating material such as silicon oxide (SiOx) or silicon nitride (SiNx), or may be made of an organic insulating material such as benzocyclobutene (BCB), an acrylic material, or polyimide. The gate insulating layer 30 covers the gate wiring and the storage wiring. In particular, the gate insulating layer 30 is formed on the whole surface of the insulating substrate 10, including a pixel region in which the pixel electrode 82 is formed. Here, a pixel region may be understood as a region which is defined by the gate wiring and the data wiring. In the case of LCDs, the pixel region may be understood as a region through which light emitted from a backlight assembly (not shown) passes. In the case of organic electroluminescent displays, the pixel region may be understood as an organic light-emitting layer.

The oxide semiconductor pattern 46 is formed on the gate insulating layer 30. The oxide semiconductor pattern 46 may be made of an oxide of a material such as zinc (Zn), indium (In), gallium (Ga), tin (Sn), hafnium (Hf), or a combination of the same. For example, the oxide semiconductor pattern 46 may be made of a mixed oxide such as InZnO, InGaO, InSnO, ZnSnO, GaSnO, GaZnO, GaZnSnO, GaInZnO, HfInZnO, or ZnO.

The oxide semiconductor pattern 46 has 2 to 100 times greater effective charge mobility than hydrogenated amorphous silicon and an ON/OFF current rate of $10^5$ to $10^8$. Thus, the oxide semiconductor pattern 46 shows excellent semiconductor properties. In addition, the oxide semiconductor pattern 46 has a band gap of approximately 3.0 to 3.5 eV. Therefore, even when the oxide semiconductor pattern 46 is exposed to visible light, it does not experience the leakage of photocurrent. Consequently, an instantaneous afterimage can be prevented from being formed by an oxide TFT. Furthermore, since there is no need to form a light-blocking film under the oxide TFT, an aperture ratio of the TFT substrate can be increased.

In order to enhance the properties of an oxide semiconductor, the oxide semiconductor pattern 46 may additionally include an element, which belongs to group 3, 4 or 5 of the periodic table of the chemical elements, or a transition element thereof. While the oxide semiconductor pattern 46 is amorphous, it has high effective charge mobility and can be formed by using a conventional method of manufacturing amorphous silicon. Therefore, the oxide semiconductor pattern 46 can be applied to display devices having large areas.

The oxide semiconductor pattern 46 is formed in a TFT region in which the gate electrode 24 is overlapped by the source electrode 64 and the drain electrode 66 and in a pixel electrode formation region in which the pixel electrode 82 is formed.

Since the oxide semiconductor pattern 46 according to an exemplary embodiment is formed at the same time as a pixel electrode pattern 41, which will be described later, the oxide semiconductor pattern 46 is formed in the pixel electrode formation region. A plasma-treatment process, which will be described later, is performed on the pixel electrode pattern 41 to form the pixel electrode 82. The pixel electrode 82 extends from the oxide semiconductor pattern 46. For example, the pixel electrode 82 and the oxide semiconductor pattern 46 may be connected to each other.

The source electrode 64, the drain electrode 66, and the oxide semiconductor pattern 46 are etched simultaneously. Accordingly, the source or drain electrode 64 or 66 and a sidewall of the oxide semiconductor pattern 46 may have the same etched surface. Here, the phrase "have the same etched surface" may denote that when two or more layers are simultaneously etched, their etched surfaces are connected to each other.

The oxide semiconductor protection film patterns 55 and 56 are formed on the oxide semiconductor pattern 46. The oxide semiconductor protection film patterns 55 and 56 are designed to protect an oxide semiconductor layer when a data wiring conductive layer is etched to form the source electrode 64 and the drain electrode 66. Specifically, the oxide semiconductor protection film patterns 55 and 56 are formed on the whole surface of the substrate 10 to protect the oxide semiconductor layer when the data wiring conductive layer is etched. After the source and drain electrodes 64 and 66 are formed by etching the data wiring conductive layer, the oxide semiconductor protection film patterns 55 and 56 are patterned in the same shape as the source and drain electrodes 64 and 66.

The oxide semiconductor protection film patterns 55 and 56 may be made of a material which has a high etch selectivity with respect to the data wiring conductive layer and which can form an ohmic contact with the oxide semiconductor pattern 46 and the source and drain electrodes 64 and 66. For example, the oxide semiconductor layer protection film patterns 55 and 56 may be made of a transparent conductor such as silicide, InSnO (ITO) or InZnO (IZO), n+ hydrogenated amorphous silicon doped with n-type impurities in high concentration, or a material doped with p-type impurities (such as ITO).

The oxide semiconductor protection film patterns 55 and 56 can improve contact characteristics between the source electrode 64 and the oxide semiconductor pattern 46 and between the drain electrode 66 and the oxide semiconductor pattern 46. The oxide semiconductor protection film patterns 55 and 56 may have a contact region (not shown) which is plasma-treated with a hydrogen-containing gas. The contact region electrically connects the pixel electrode 82 and the drain electrode 66 which will be described later.

The data wiring is formed on the resultant structure including the oxide semiconductor protection film patterns 55 and 56. The data wiring includes the data line, the source electrode 64, the drain electrode 66, and a data line end.

The data line extends in the second direction, for example, the vertical direction. In addition, the data line is insulated from the gate line 22 and crosses the gate line 22.

The source electrode 64 branches off from the data line and extends onto the oxide semiconductor pattern 46. The data line end is formed at an end of the data line. The data line end receives a data signal from another layer or an external source and delivers the received data signal to the data line.

The source electrode 64 overlaps at least part of the oxide semiconductor pattern 46. The drain electrode 66 is separated from the source electrode 64 and is disposed on the oxide semiconductor pattern 46 to face the source electrode 64 with respect to the gate electrode 24. The oxide semiconductor pattern 46 is exposed by the gap between the source electrode 64 and the drain electrode 66.

A TFT is a three-terminal device composed of the gate electrode 24, the source electrode 64 and the drain electrode 66. In addition, the TFT is a switching device that allows current to flow between the source electrode 64 and the drain electrode 66 when a voltage is applied to the gate electrode 24.

The drain electrode 66 includes a bar-shaped pattern which is disposed on the oxide semiconductor pattern 46 and a drain electrode extension portion which extends from the bar-shaped pattern and has a large area.

The data wiring (including the source electrode 64 and the drain electrode 66) may include a monolayer or a multilayer made of a material or materials selected from Al, an Al alloy (e.g., Al, AlNd, AlCu, etc.), Cr, a Cr alloy, Mo, a Mo alloy (e.g., Mo, MoN, MoNb, etc.), Ta, a Ta alloy, Ti, and a Ti alloy. For example, the data wiring may be made of Cr, Mo-based metal, or refractory metal such as Ta and Ti. In addition, the data wiring may have a multilayer structure composed of a lower layer (not shown), which is made of refractory metal, and an upper layer (not shown) which is made of a material with low resistivity and is disposed on the lower layer. Examples of multilayer structures include a Cr lower layer and an Al upper layer and an Al lower layer and a Mo upper layer. Alternatively, the multilayer structure may be a three-layer structure having Mo—Al—Mo layers.

The passivation film 71 is formed on the data wiring and the oxide semiconductor pattern 46. The passivation film 71 may be made of an inorganic material such as silicon nitride or silicon oxide, an organic material having photosensitivity and superior planarization characteristics, or a low-k insulating material formed by plasma enhanced chemical vapor deposition (PECVD), such as a-Si:C:O or a-Si:O:F.

The pixel electrode 82 is formed on the gate insulating layer 30 and extends from the oxide semiconductor pattern 46. Accordingly, the pixel electrode 82 may be made of the same material as the oxide semiconductor pattern 46. For example, like the oxide semiconductor pattern 46, the pixel electrode 82 may be made of any one of InZnO, InGaO, InSnO, ZnSnO, GaSnO, GaZnO, GaZnSnO, GaInZnO, HfInZnO, and ZnO. If the pixel electrode 82 is made of any one of the above materials, it may be difficult for the pixel electrode 82 to have desired conductive properties. Thus, the pixel electrode 82 may be plasma-treated to enhance conductive properties thereof. Specifically, when a plasma-treatment process is performed in a hydrogen-containing gas atmosphere such as $H_2$ or $NH_3$, the oxygen concentration in the above materials may be reduced, thereby improving conductive properties of the above materials. For example, physical properties of the above materials change from semiconductive to conductive. Accordingly, the pixel electrode 82 can have required conductive properties. For example, after plasma treatment, an oxide semiconductor used as an active layer in a channel region of a TFT can also be used as a pixel electrode.

Hereinafter, a method of manufacturing a TFT substrate according to an exemplary embodiment of the present invention will be described with reference to FIGS. 3 through 14.

Figure 3:
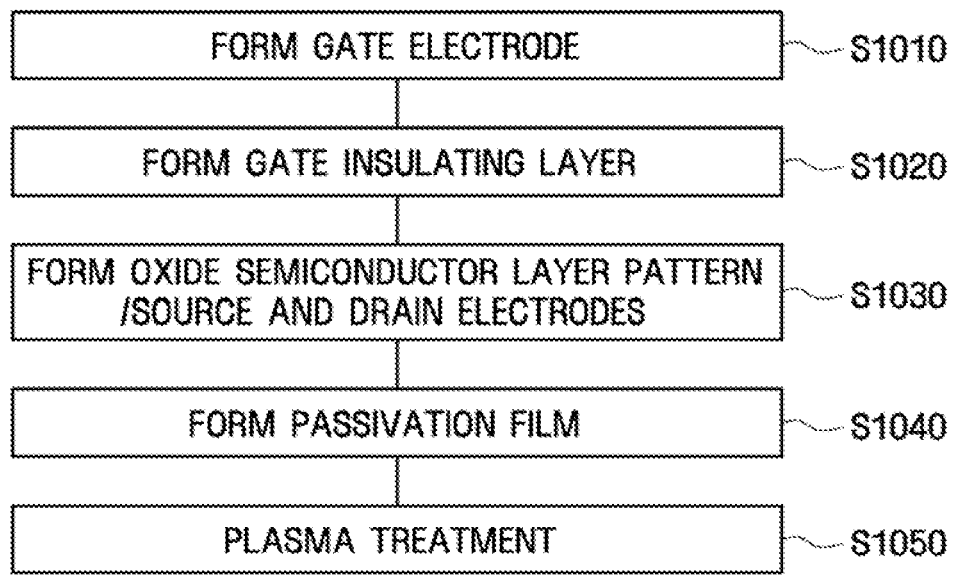
FIG. 3 is a flowchart illustrating a method of manufacturing a TFT substrate according to an exemplary embodiment of the present invention.
Figure 4:
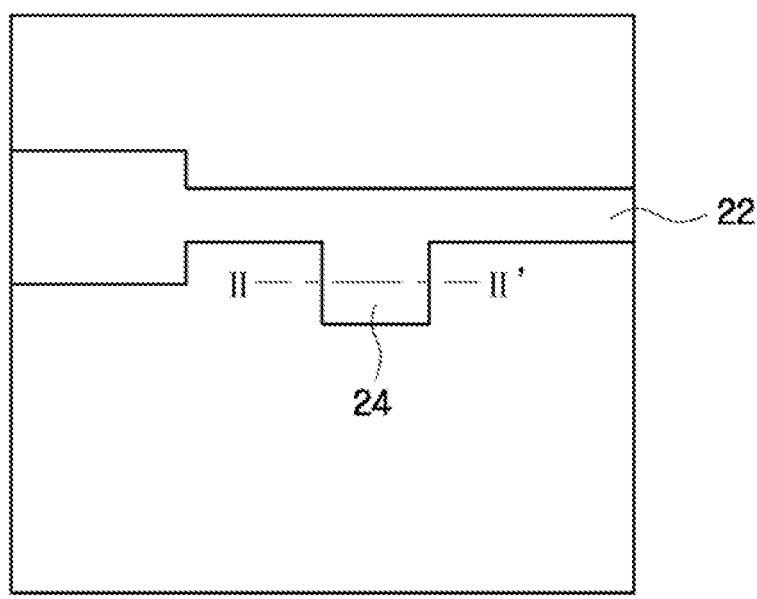
FIG. 4 is a layout view illustrating a method of manufacturing the TFT substrate illustrated in FIG. 3 according to an exemplary embodiment of the present invention.
Figure 5:
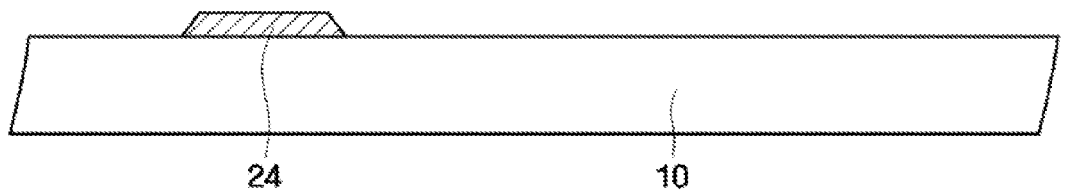
FIG. 5 is a cross-sectional view of the TFT substrate taken along the II-II' of FIG. 4.
Figure 6:
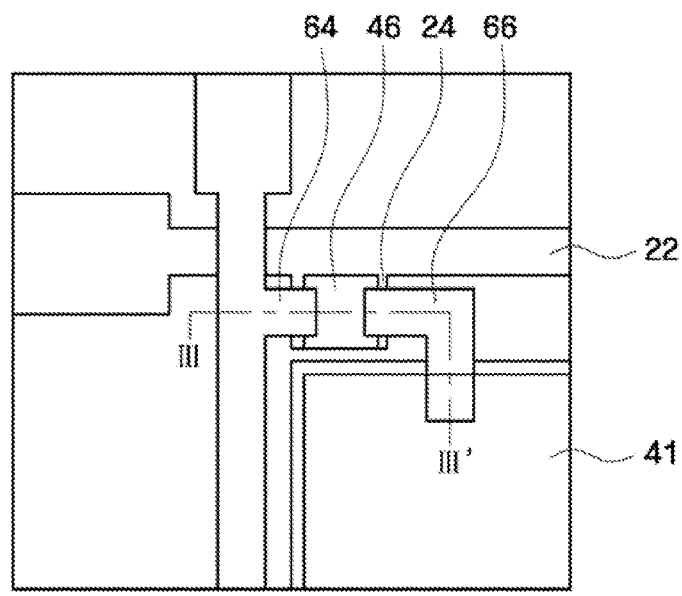
FIG. 6 is a layout view illustrating a method of manufacturing the TFT substrate illustrated in FIG. 3 according to an exemplary embodiment of the present invention.

FIG. 3 is a flowchart illustrating a method of manufacturing a TFT substrate according to an exemplary embodiment of the present invention. FIGS. 4 and 6 are layout views sequentially illustrating the method of manufacturing the TFT substrate according to an exemplary embodiment of the present invention. FIG. 5 is a cross-sectional view of the TFT substrate taken along the II-II' of FIG. 4. FIGS. 7 through 14 are cross-sectional views of the TFT substrate taken along the line III-III' of FIG. 6.

Referring to FIGS. 3 through 5, a gate wiring including a gate electrode 24 is formed on a substrate 10 (operation S1010). For example, a gate conductive layer is stacked on the substrate 10 by, e.g., sputtering. Then, a photolithography process is performed on the gate conductive layer to form a gate line 22 and the gate electrode 24. At this time, a storage wiring (not shown) including a storage line (not shown) and a storage electrode (not shown) may also be formed.

Figure 7:
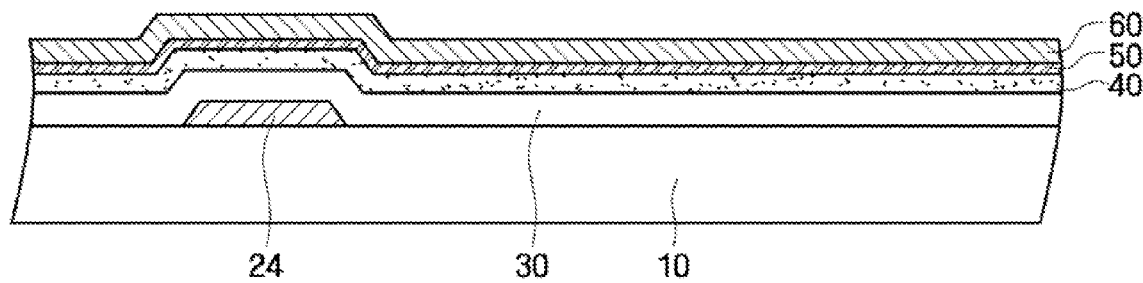
FIGS. 7 through 14 are cross-sectional views of the TFT substrate taken along the line III-III' of FIG. 6.

Referring to FIGS. 3, 6 and 7, a gate insulating layer 30, an oxide semiconductor layer 40 and an oxide semiconductor protection film layer 50 are formed on the resultant structure. The gate insulating layer 30, the oxide semiconductor layer 40 and the oxide semiconductor protection film layer 50 may be deposited by, for example, chemical vapor deposition (CVD) (operation S1020). Then, a data conductive layer 60 is deposited on the oxide semiconductor protection film layer 50 by, for example, sputtering.

Figure 8:
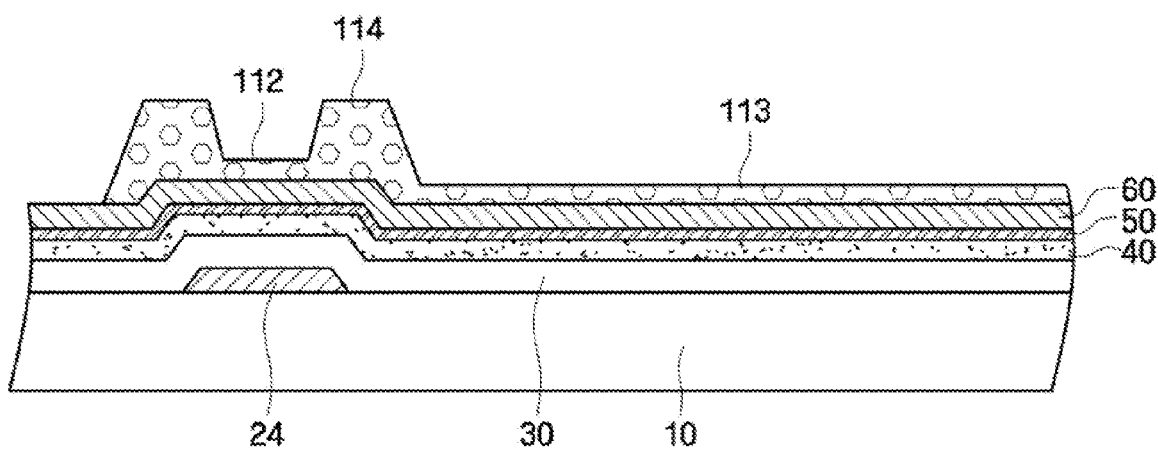

Next, referring to FIG. 8, the data conductive layer 60 is coated with a photosensitive film. Then, the photosensitive film is patterned to form a photosensitive film pattern. The photosensitive film pattern includes two regions having different thicknesses. Specifically, a first region 114 is formed on a data wiring and the gate electrode 24. A second region 112 is thinner than the first region 114 and is formed to cover a region, in which a channel portion is to be formed, on the gate electrode 24. The photosensitive film pattern having the first and second regions 112 and 114 of different thicknesses may be formed using a slit mask or a halftone mask.

Figure 9:
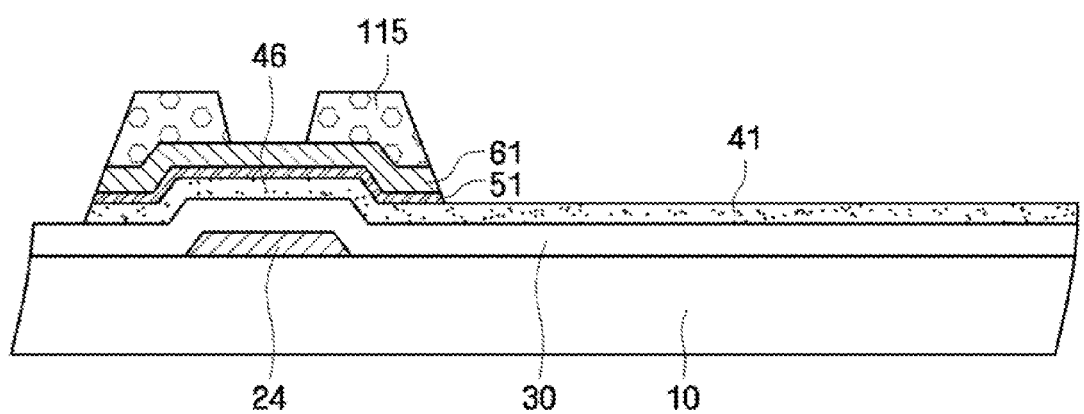

Next, referring to FIGS. 3, 6 and 9, an exposed portion of the data conductive layer 60 is etched by using the photosensitive film pattern as an etch mask. The process of etching the data conductive layer 60 may vary according to the type and thickness of the data conductive layer 60. For example, the data conductive layer 60 may be wet-etched. As a result of the wet-etching process, a data line and a data conductive layer pattern 61 are formed. Here, the data conductive layer pattern 61 formed on the gate electrode 24 remains undivided into a source electrode 65 and a drain electrode 66. The oxide semiconductor protection film layer 50 protects the oxide semiconductor layer 40 thereunder while the data conductive layer 60 is etched.

Next, an exposed portion of the oxide semiconductor protection film layer 50 and the oxide semiconductor layer 40 thereunder are etched by using the photosensitive film pattern as an etch mask, thereby forming an oxide semiconductor protection film layer pattern 51 and an oxide semiconductor layer pattern thereunder (operation S1030). Here, the oxide semiconductor protection film layer 50 and the oxide semiconductor layer 40 may be, e.g., dry-etched. As a result of the dry-etching process, the gate insulating layer 30 is exposed.

The oxide semiconductor layer pattern may include an oxide semiconductor pattern 46 and a pixel electrode pattern 41. The pixel electrode pattern 41 extends from the oxide semiconductor pattern 46. For example, the pixel electrode pattern 41 and the oxide semiconductor pattern 46 are connected to each other.

Next, referring to FIGS. 3, 6 and 9, the whole surface of the photosensitive film pattern is etched. As a result, the second region 112 which is thinner than the first region 114 is removed, thereby exposing a portion of the data conductive layer pattern 61 under the second region 112. Here, the thickness of the first region 114 is also reduced. The whole surface of the photosensitive film pattern may be etched using an ashing process that uses, for example, oxygen plasma. Accordingly, a second photosensitive film pattern 115 is formed to expose a portion of the data conductive layer pattern 61. If the second region 112 is also removed when the oxide semiconductor protection film layer 50 and the oxide semiconductor layer 40 are etched, the ashing process may be omitted.

Figure 10:
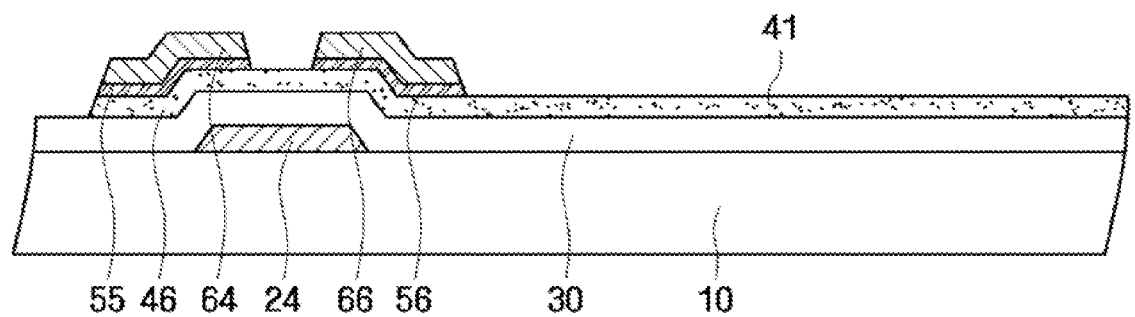

Next, referring to FIGS. 3, 6 and 10, the exposed portion of the data conductive layer pattern 61 and the oxide semiconductor protection film pattern 51 thereunder are etched by using the second photosensitive film pattern 115 as an etch mask. As a result, the data conductive layer pattern 61 is divided into a source electrode 64 and a drain electrode 66, and the oxide semiconductor protection film layer pattern 51 is divided into a pair of oxide semiconductor protection film patterns 55 and 56. Accordingly, the source electrode 64, the drain electrode 66, and the oxide semiconductor protection film patterns 55 and 56 are formed (operation S1030).

Figure 11:
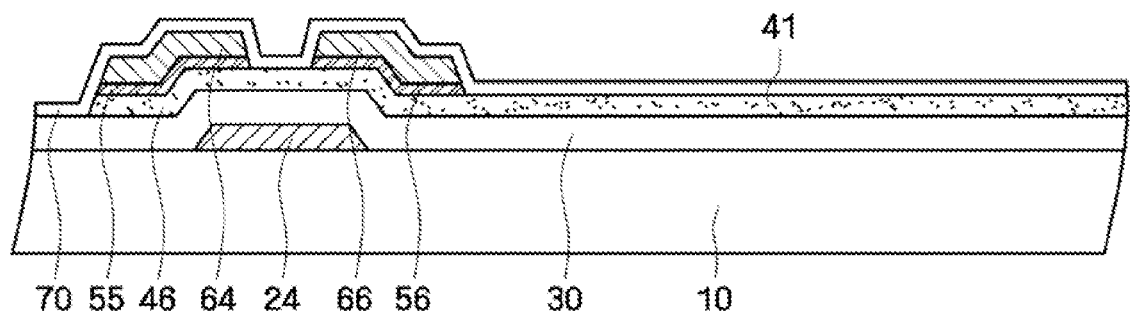

Then, referring to FIGS. 3, 6, and 11, a passivation layer 70 is formed on the resultant structure by, for example, CVD.

Figure 12:
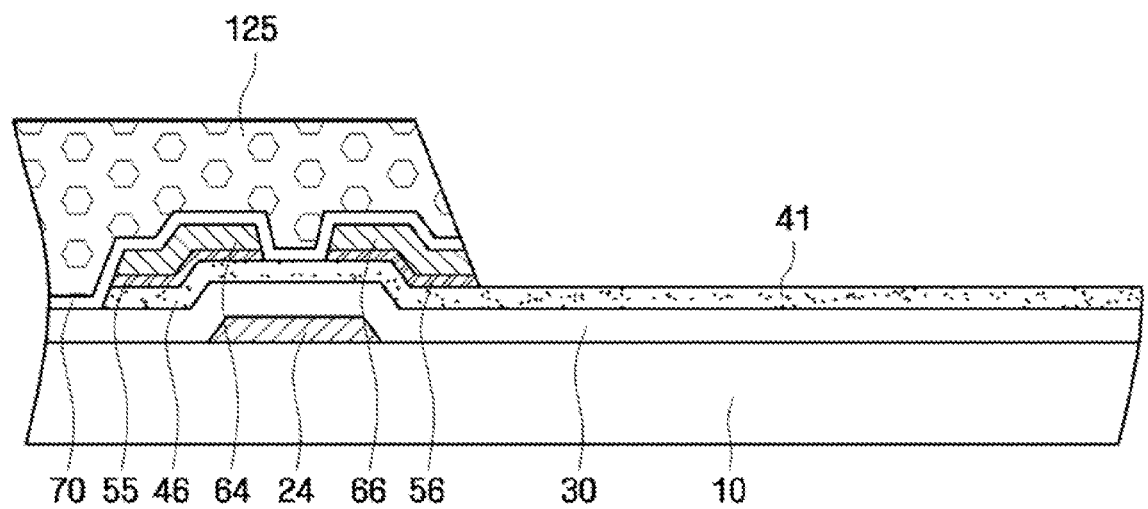

Next, referring to FIG. 12, a third photosensitive film pattern 125 is formed on a portion of the passivation layer 70 which overlaps a TFT, and then the passivation layer 70 is patterned. Accordingly, a passivation film 71 is formed to cover the source and drain electrodes 64 and 66 and expose the pixel electrode pattern 41.

Figure 13:
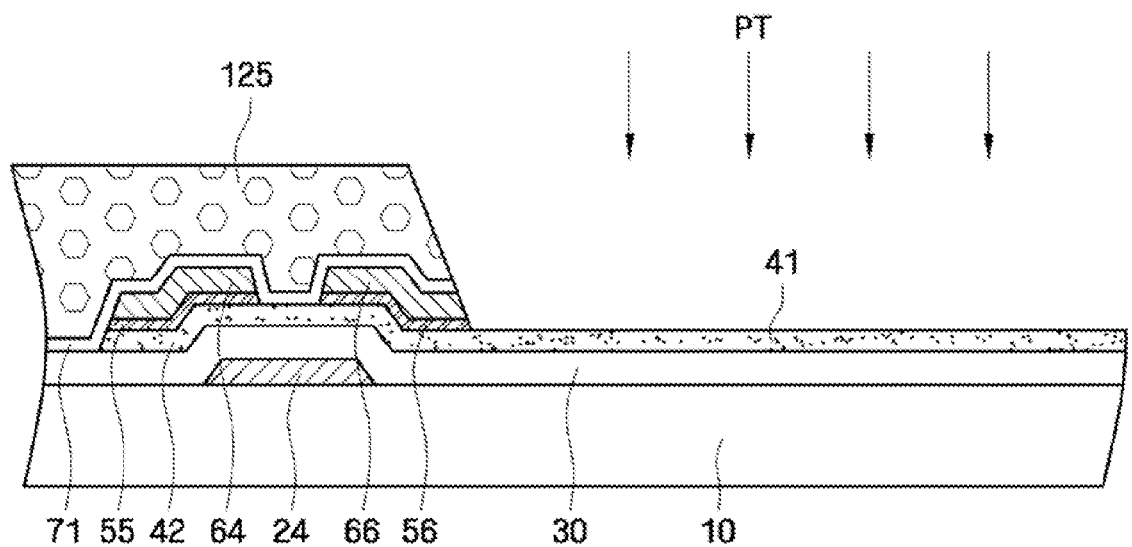

Then, referring to FIGS. 3, 6 and 13, the pixel electrode pattern 41 of the resultant structure is plasma-treated (operation S1050). The plasma-treatment process causes physical properties of the pixel electrode pattern 41, which is made of the same material as the oxide semiconductor pattern 46, to change from semiconductive to conductive. The plasma-treatment process may be performed using a hydrogen-containing gas, for example, in a gas atmosphere such as $H_2$ or $NH_3$. In addition, the plasma-treatment process may be performed for 1 to 30 seconds under pressure conditions of approximately 1000 to 3000 mTorr and using a high-frequency RF power of approximately 100 to 400 mW/cm$^2$-time. Here, the oxide semiconductor protection film patterns 55 and 56 may also be plasma-treated with a hydrogen-containing gas. Accordingly, a contact region may be formed at an edge of the oxide semiconductor protection film patterns 55 and 56. The contact region electrically connects a pixel electrode 82, which will be described later, to the drain electrode 66.

Figure 14:
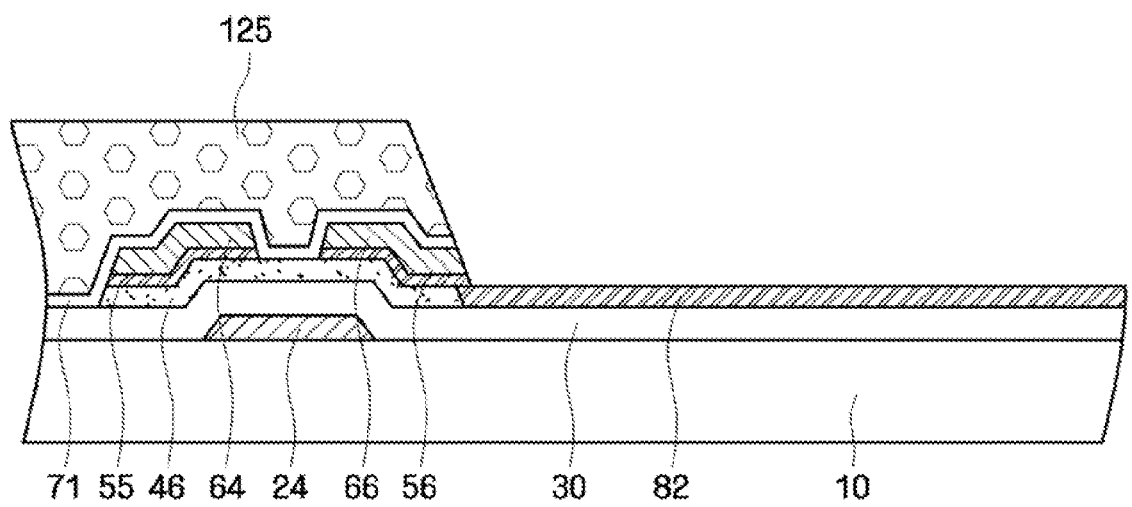

Referring to FIG. 14, the pixel electrode 82 is formed as a result of the plasma-treatment process. The pixel electrode 82 extends from the oxide semiconductor pattern 46. For example, the pixel electrode 82 and the oxide semiconductor pattern 46 are formed as a single layer having a predetermined shape. Next, the whole surface of the third photosensitive film pattern 125 is etched, thereby completing the TFT substrate of FIG. 2. This etching process may be performed using an ashing process that uses, e.g., oxygen plasma.

Hereinafter, a display device according to an exemplary embodiment of the present invention will be described with reference to FIGS. 15 and 16.

Figure 15:
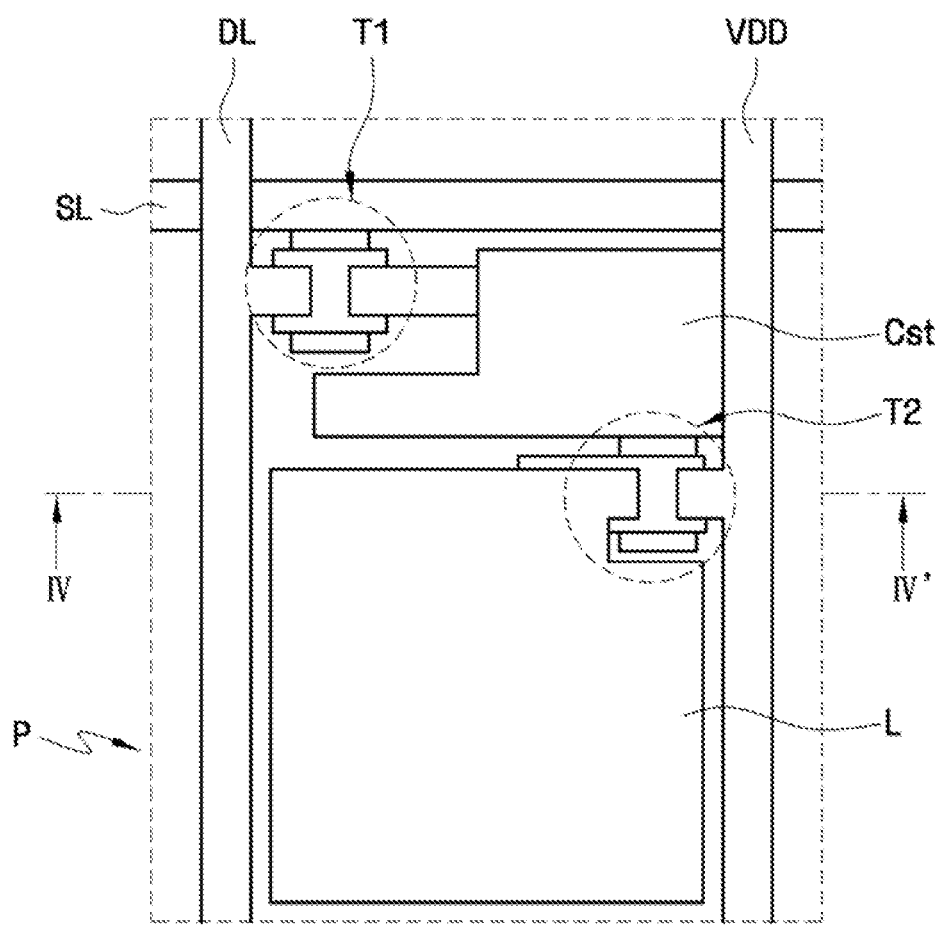
FIG. 15 is a plan view of a pixel included in an organic light-emitting diode (OLED) display device according to an exemplary embodiment of the present invention.

FIG. 15 is a plan view of a pixel P included in an organic light-emitting diode (OLED) display device according to an exemplary embodiment of the present invention. FIG. 16 is a cross-sectional view of the pixel P taken along the line IV-IV' of FIG. 15. For simplicity, elements having the same functions as those illustrated in the drawings for the first exemplary embodiment are indicated by like reference numerals, and thus their description will be omitted.

Referring to FIG. 15, the pixel P included in the OLED display device may include a first TFT T1, a scan line SL, a data line DL, a capacitor Cst, a light-emitting element L, and a second TFT T2.

In the pixel P, the scan line SL extends in a direction of a substrate, and the data line DL and a power line VDD are separated from each other and extend in a direction that intersects the direction in which the scan line SL extends. For example, the direction of extension of the data line DL and the power line VDD may be perpendicular to that of the scan line SL. The first and second TFTs T1 and T2, the capacitor Cst, and the light-emitting element L are formed in a region defined by the scan line SL, the data line DL, and the power line VDD.

The first TFT T1 is connected to each of the scan line SL and the data line DL. Accordingly, the first TFT T1 applies a data voltage received from the data line DL to a gate electrode of the second TFT T2 in response to a switching signal of the scan line SL. The capacitor Cst is connected to each of the first TFT T1 and the power line VDD. Accordingly, the capacitor Cst accumulates the amount of electric charge, which corresponds to the voltage difference between the gate electrode of the second TFT T2 and the power line VDD, in response to a voltage received from the data line DL.

Figure 16:
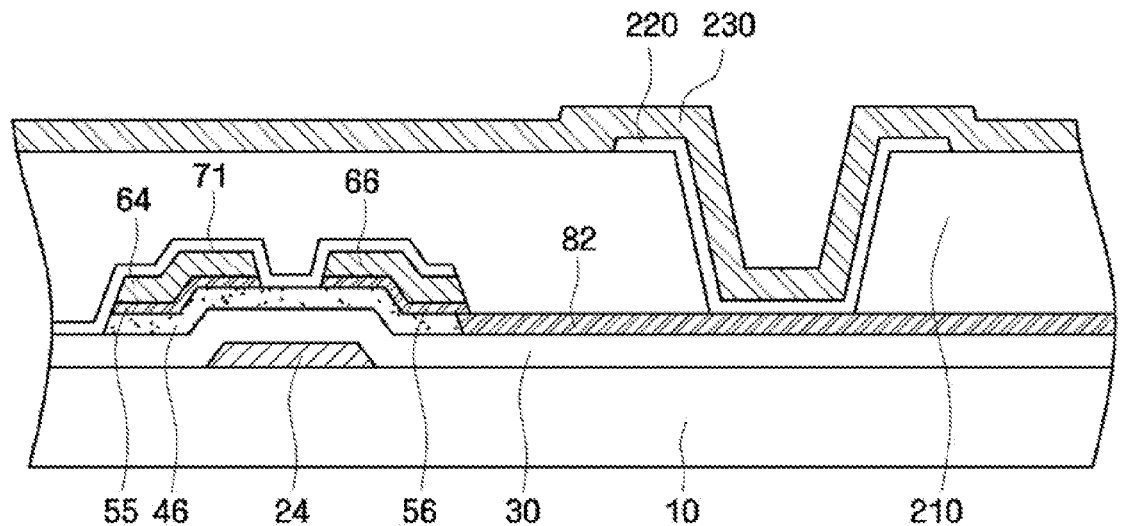
FIG. 16 is a cross-sectional view of the pixel taken along the line IV-IV' of FIG. 15.

Referring to FIGS. 15 and 16, the OLED display device according to an exemplary embodiment may include a common electrode 230 which faces a pixel electrode 82, an organic light-emitting layer 220, and a planarization layer 210. Furthermore, the OLED display device may include a TFT substrate. The TFT substrate includes a gate electrode 24 formed on a substrate 10, a gate insulating layer 30 formed on the gate electrode 24, an oxide semiconductor pattern 46 formed on the gate insulating layer 30, a source electrode 64 formed on the oxide semiconductor pattern 46, a drain electrode 66 formed on the oxide semiconductor pattern 46 and separated from the source electrode 64, and the pixel electrode 82 formed on the gate insulating layer 30 and extending from the oxide semiconductor pattern 46.

The organic light-emitting layer 220 is formed between the pixel electrode 82 and the common electrode 230. When a current is supplied to the organic light-emitting layer 220, electrons and holes in the organic light-emitting layer 220 recombine to form excitons, and the energy of the excitons causes light of a predetermined wavelength to be generated.

The organic light-emitting layer 220 may be made of a low molecular organic material or a high molecular organic material. The organic light-emitting layer 220 may include a hole-injection layer, a hole-transporting layer, a hole-blocking layer, an electron-transporting layer, an electron-injection layer, and an electron-blocking layer.

Figure 17:
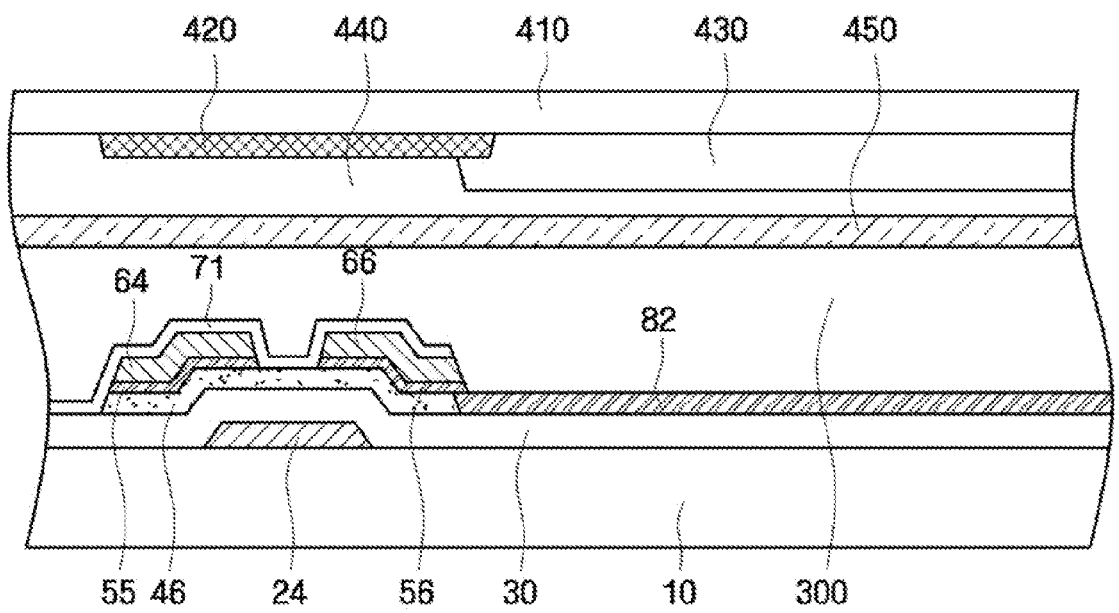
FIG. 17 is a cross-sectional view of a display device according to an exemplary embodiment of the present invention.

Hereinafter, a display device according to an exemplary embodiment of the present invention will be described with reference to FIG. 17. FIG. 17 is a cross-sectional view of a display device according to an exemplary embodiment of the present invention. For simplicity, elements having the same functions as those illustrated in the drawings for the first exemplary embodiment are indicated by like reference numerals, and thus their description will be omitted.

Referring to FIG. 17, the display device according to an exemplary embodiment may include a TFT substrate and a common electrode 450 which faces a pixel electrode 82. The TFT substrate includes a gate electrode 24 formed on a substrate 10, a gate insulating layer 30 formed on the gate electrode 24, an oxide semiconductor pattern 46 formed on the gate insulating layer 30, a source electrode 64 formed on the oxide semiconductor pattern 46, a drain electrode 66 formed on the oxide semiconductor pattern 46 that is separated from the source electrode 64, and the pixel electrode 82 formed on the gate insulating layer 30 extending from the oxide semiconductor pattern 46.

The display device may further include an opposite substrate. The opposite substrate includes an insulating substrate 410, a black matrix 420 for preventing leakage of light, a color filter 430 for representing a color, an overcoat 440 for reducing the step difference between the black matrix 420 and the color filter 430, and the common electrode 450 formed on the overcoat 440. The opposite substrate faces the TFT substrate.

A liquid crystal layer 300 is interposed between the TFT substrate and the opposite substrate. The liquid crystal layer 300 controls transmittance of light emitted from a backlight (not shown) based on the voltage difference between the pixel electrode 82 and the common electrode 450.

Figure 18:
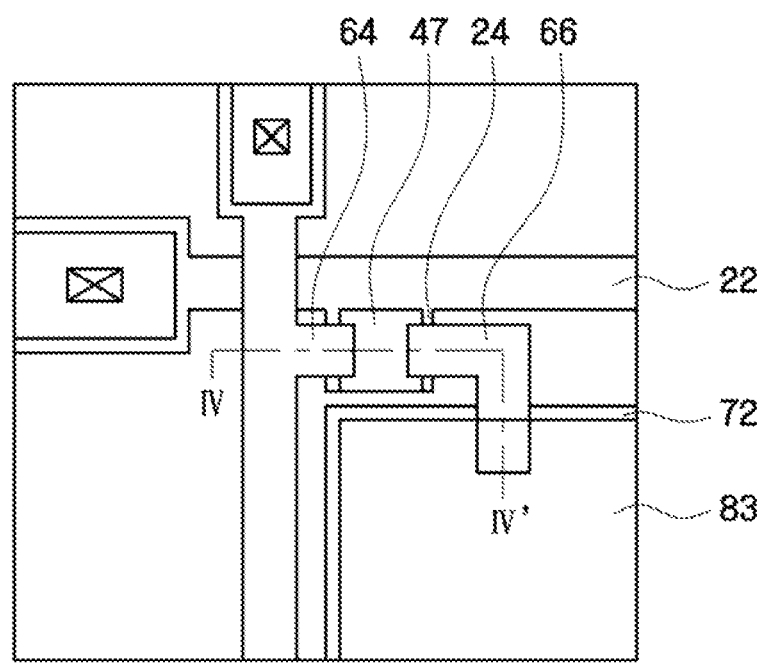
FIG. 18 is a layout view of a TFT substrate according to an exemplary embodiment of the present invention.
Figure 19:
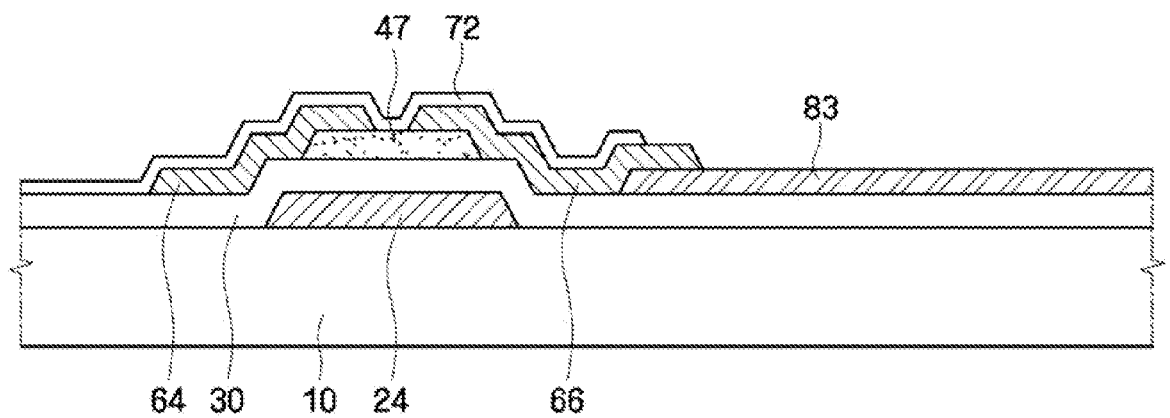
FIG. 19 is a cross-sectional view of the TFT substrate taken along the line IV-IV' of FIG. 18.

Hereinafter, a TFT substrate according to an exemplary embodiment of the present invention will be described with reference to FIGS. 18 and 19. FIG. 18 is a layout view of a TFT substrate according to an exemplary embodiment of the present invention. FIG. 19 is a cross-sectional view of the TFT substrate taken along the line IV-IV' of FIG. 18.

The TFT substrate may include a gate wiring (including a gate line 22 and a gate electrode 24), a gate insulating layer 30, an oxide semiconductor pattern 47, a data wiring (including a source electrode 64 and a drain electrode 66), a passivation film 72, and a pixel electrode 83. The TFT substrate may be substantially the same as the TFT substrate described above with reference to FIGS. 1 and 2 except that the oxide semiconductor pattern 47 is separated from the pixel electrode 83. For simplicity, elements having the same functions as those illustrated in FIGS. 1 and 2 are indicated by like reference numerals, and thus their description will be omitted or simplified.

The oxide semiconductor pattern 47 and the pixel electrode 83 included in the TFT substrate may be formed on the same layer. For example, the oxide semiconductor pattern 47 and the pixel electrode 83 are formed on the gate insulating layer 30. Here, the oxide semiconductor pattern 47 and the pixel electrode 83 may neighbor each other.

The pixel electrode 83 and the oxide semiconductor pattern 47 are respectively made of the same materials as the pixel electrode 82 and the oxide semiconductor pattern 46 described above with respect to FIGS. 1 and 2.

The pixel electrode 83 may electrically contact the drain electrode 66 included in the data wiring. Specifically, a lower surface of the drain electrode 66 may contact an upper surface of the pixel electrode 83.

Hereinafter, a method of manufacturing a TFT substrate according to an exemplary embodiment of the present invention will be described with reference to FIGS. 20 through 29.

Figure 20:
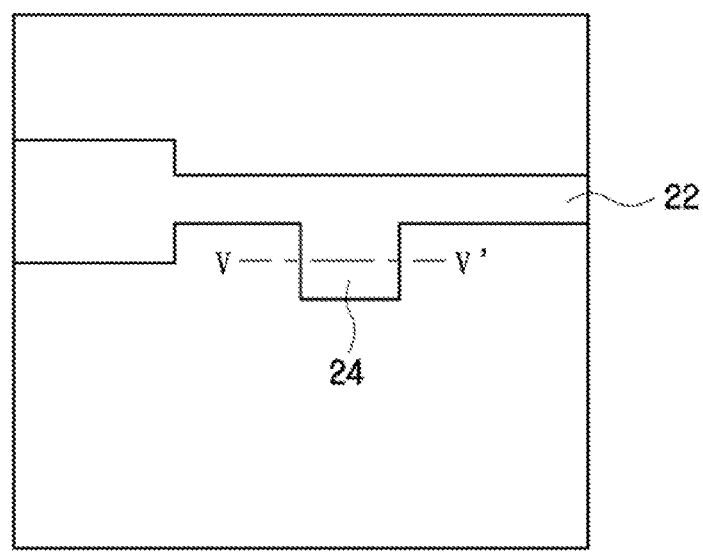
FIGS. 20, 22 and 25 are layout views sequentially illustrating a method of manufacturing a TFT substrate according to an exemplary embodiment of the present invention.
Figure 21:
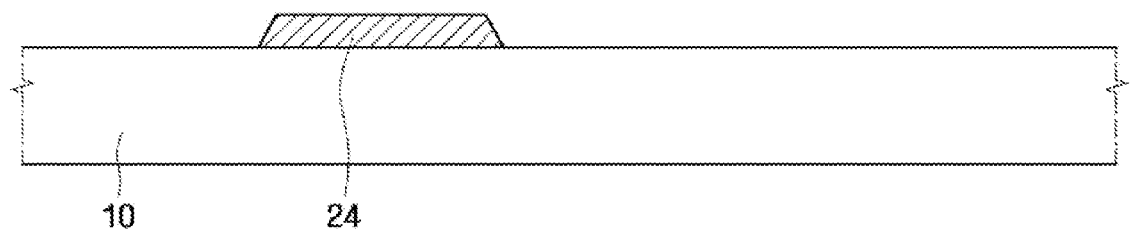
FIG. 21 is a cross-sectional view of the TFT substrate taken along the V-V' of FIG. 20.
Figure 22:
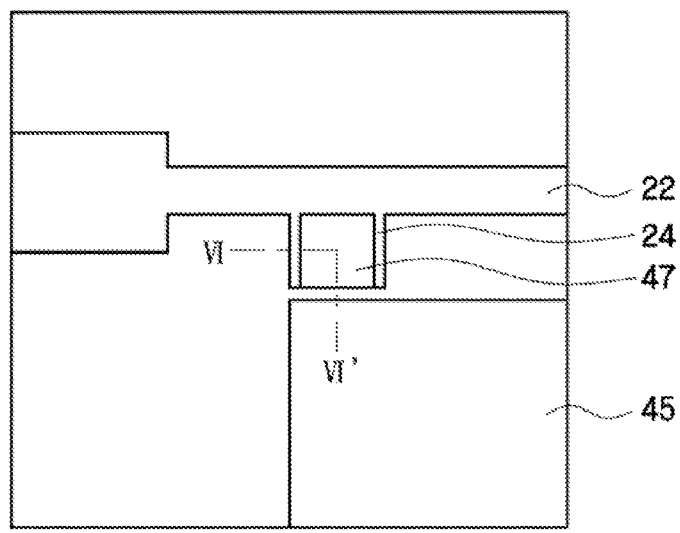
Figure 23:
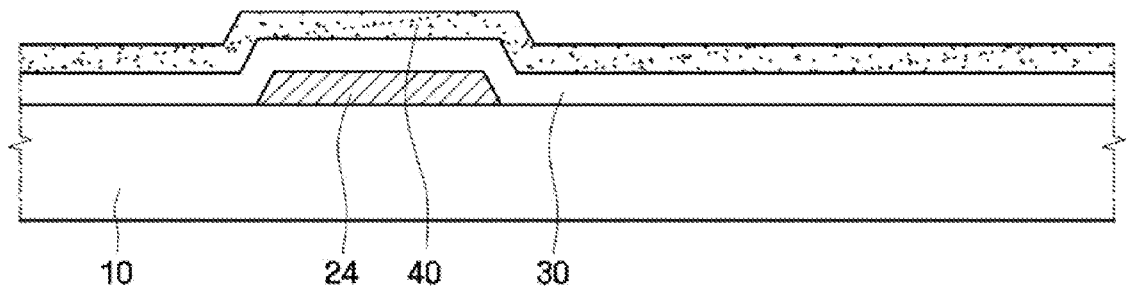
FIGS. 23 and 24 are cross-sectional views of the TFT substrate taken along the line VI-VI' of FIG. 22.
Figure 24:
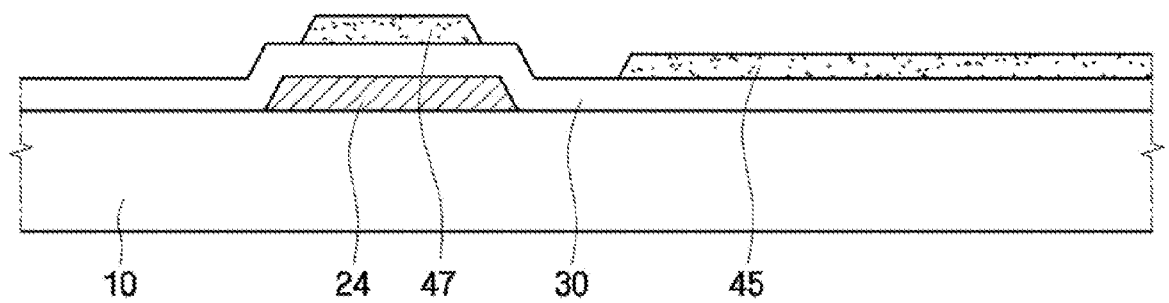
Figure 25:
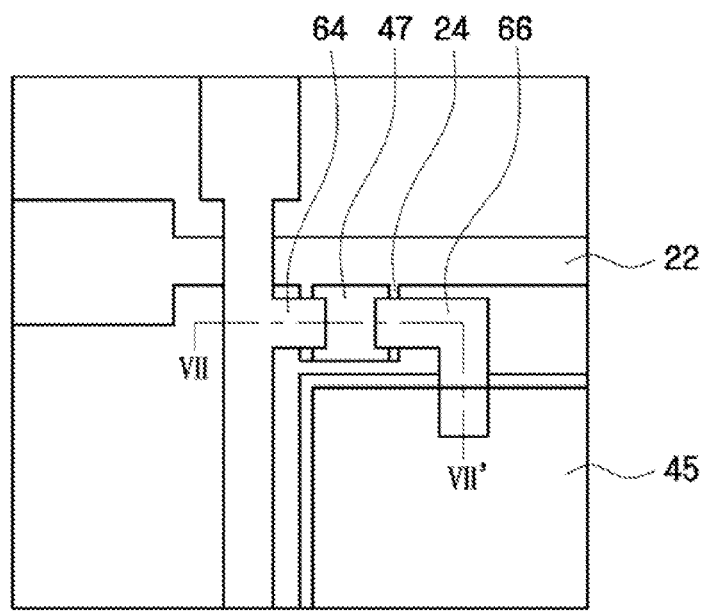

FIGS. 20, 22 and 25 are layout views sequentially illustrating a method of manufacturing a TFT substrate according to an exemplary embodiment of the present invention. FIG. 21 is a cross-sectional view of the TFT substrate taken along the V-V' of FIG. 20. FIGS. 23 and 24 are cross-sectional views of the TFT substrate taken along the line VI-VI' of FIG. 22. FIGS. 26 through 29 are cross-sectional views of the TFT substrate taken along the line VII-VII' of FIG. 25. The method of manufacturing the TFT substrate is substantially the same as the method of manufacturing the TFT substrate as described above with reference to FIGS. 3-14 except that an oxide semiconductor pattern 47 and a pixel electrode 83 are formed separated from each other. For simplicity, elements having the same functions as those illustrated in FIGS. 3-14 are indicated by like reference numerals, and thus their description will be omitted or simplified.

Referring to FIGS. 22 through 24, a gate insulating layer 30 and an oxide semiconductor layer 40 are formed on a structure shown in FIG. 21. The gate insulating layer 30 and the oxide semiconductor layer 40 may be deposited on the structure by, e.g., CVD.

Then, the oxide semiconductor layer 40 is patterned to form the oxide semiconductor pattern 47 and a pixel electrode pattern 45. Here, the oxide semiconductor pattern 47 and the pixel electrode pattern 45 may be formed on the gate insulating layer 30 and may be separated from each other by a predetermined distance. In a subsequent process, the pixel electrode pattern 45 is changed to the pixel electrode 83.

Figure 26:
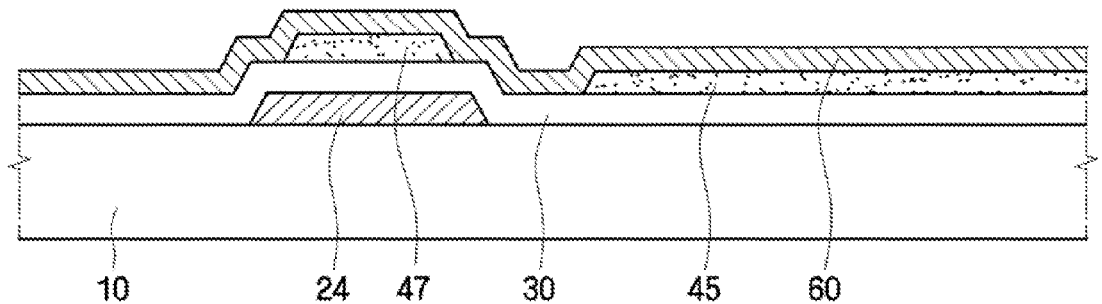
FIGS. 26 through 29 are cross-sectional views of the TFT substrate taken along the line VII-VII' of FIG. 25.

Next, referring to FIG. 26, a data conductive layer 60 is formed on the structure of FIG. 24 by, e.g., sputtering.

Figure 27:
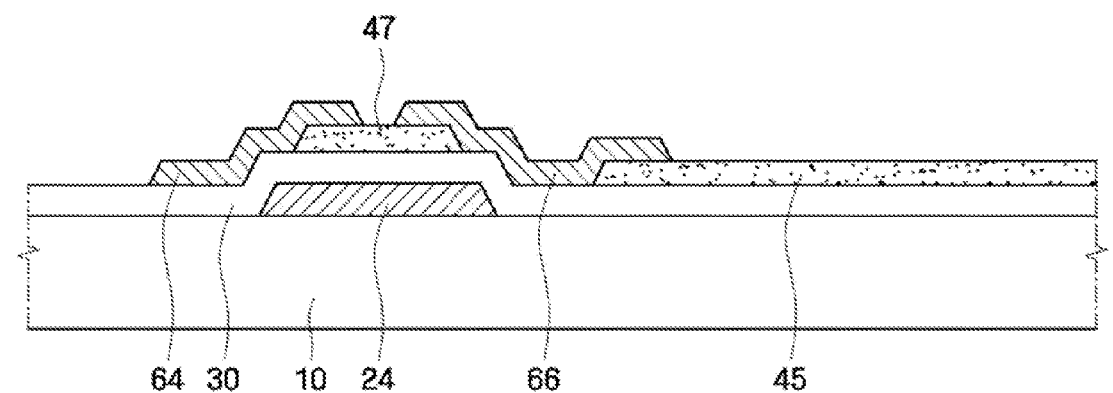

Referring to FIG. 27, the data conductive layer 60 is patterned and a source electrode 64 and a drain electrode 66 are formed thereby. Here, the source electrode 64 and the drain electrode 66 may be formed facing each other.

Figure 28:
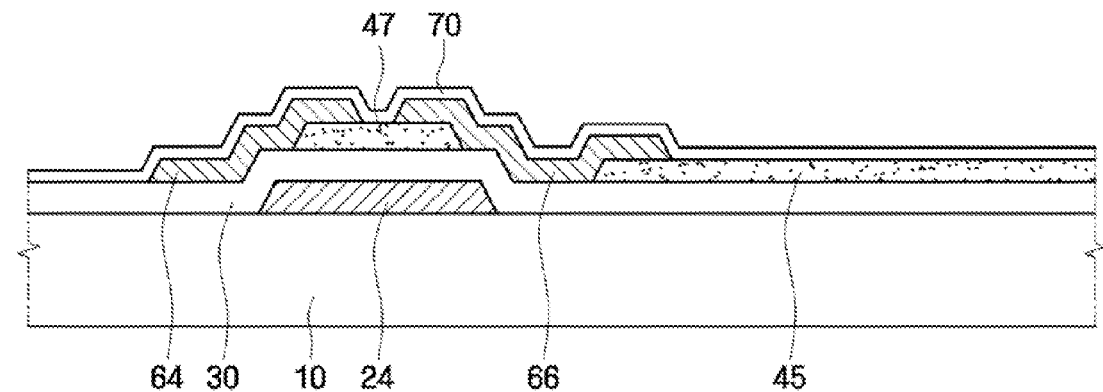

Referring to FIG. 28, a passivation layer 70 is formed on the structure of FIG. 27 by, e.g., CVD.

Figure 29:
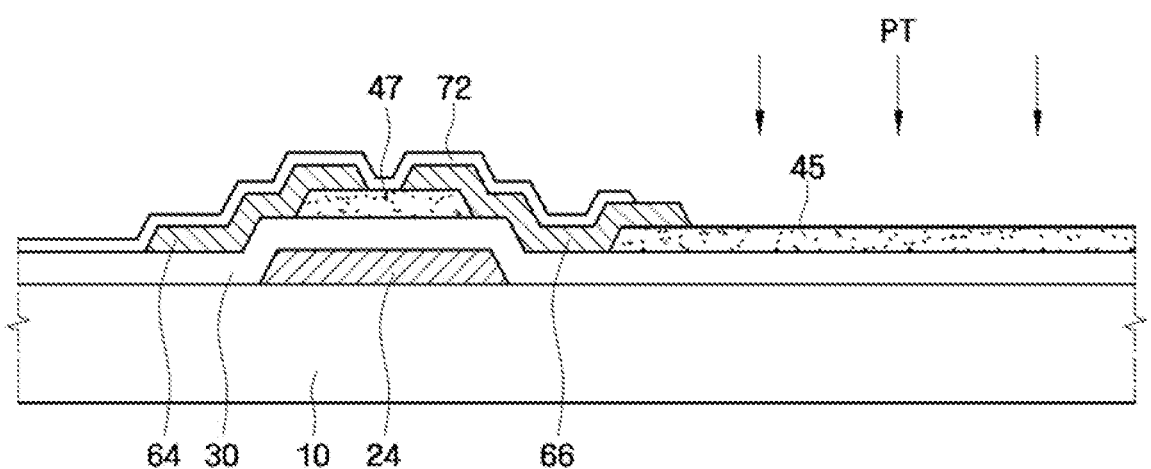

Then, referring to FIG. 29, the passivation layer 70 is patterned and a passivation film 72 which exposes the pixel electrode pattern 45 is formed. Thereafter, the pixel electrode pattern 45 is plasma-treated. The plasma-treatment process causes physical properties of the pixel electrode pattern 45, which is made of the same material as the oxide semiconductor pattern 47, to change from semiconductive to conductive. For example, the pixel electrode pattern 45 is changed to the pixel electrode 83 (see FIG. 19) by the plasma-treatment process. After the plasma-treatment process, an oxide semiconductor used as an active layer in a channel region of a TFT can also be used as a pixel electrode. The plasma-treatment process may be substantially the same as the plasma-treatment process described above with reference to FIGS. 3-14, and thus a description thereof will be omitted.

While the present invention has been particularly shown and described with reference to exemplary embodiments thereof, it will be understood by those of ordinary skill in the art that various changes in form and detail may be made therein without departing from the spirit and scope of the present invention. The exemplary embodiments should be considered in a descriptive sense only and not for purposes of limitation.

What is claimed is:

1. A method of manufacturing a TFT substrate, the method comprising:
    forming a gate electrode on a substrate;
    forming a gate insulating layer on the gate electrode;
    forming an oxide semiconductor layer pattern on the gate insulating layer;
    forming an oxide semiconductor pattern and a pixel electrode pattern from the oxide semiconductor layer pattern;
    forming semiconductor protective film patterns over the oxide semiconductor pattern;
    forming a source electrode and a drain electrode on the semiconductor protective film patterns such that the semiconductor protective film patterns separate the oxide semiconductor pattern from the source and drain electrodes, wherein the drain electrode faces the source electrode; and
    performing a plasma-treatment process on the pixel electrode pattern causing the material of the pixel electrode pattern to change from semiconductive to conductive to form a pixel electrode,
    wherein the oxide semiconductor pattern is formed using a photosensitive film pattern as an etch mask and the source electrode and the drain electrode are formed using the same photosensitive film pattern used to form the oxide semiconductor pattern as an etch mask.

2. The method of claim 1, wherein the pixel electrode is formed extending from the oxide semiconductor pattern.

3. The method of claim 1, wherein the forming of the oxide semiconductor pattern and the forming of the source and drain electrodes comprise:
    forming an oxide semiconductor layer on the gate insulating layer;
    forming a conductive layer on the oxide semiconductor layer;
    forming a first photosensitive film pattern on the conductive layer; and
    forming the oxide semiconductor pattern and the pixel electrode pattern by etching the oxide semiconductor layer using the first photosensitive film pattern and forming a conductive layer pattern by etching the conductive layer,
    wherein the first photosensitive film pattern comprises a first region and a second region which is thinner than the first region.

4. The method of claim 3, wherein the first photosensitive film pattern is formed using a halftone mask or a slit mask.

5. The method of claim 3, wherein a side of the oxide semiconductor pattern shares an etched surface with the source electrode.

6. The method of claim 3, wherein the pixel electrode pattern extends from the oxide semiconductor pattern.

7. The method of claim 6, further comprising, before the forming of the pixel electrode, forming a passivation film covering the source electrode and the drain electrode and exposing the pixel electrode pattern.

8. The method of claim 1, wherein the plasma-treatment process is performed using a hydrogen-containing gas.

9. The method of claim 1, wherein the plasma-treatment process is performed using a high-frequency RF power of approximately 100 to 400 mW/cm$_2$-time.

10. The method of claim 1, further comprising forming one or more oxide semiconductor protection film patterns between the oxide semiconductor pattern and the source and drain electrodes.

11. The method of claim 10, further comprising forming a contact region by performing a plasma-treatment process on the one or more oxide semiconductor protection film patterns using a hydrogen-containing gas.

12. The method of claim 11, wherein the contact region of the one or more oxide semiconductor protection film patterns electrically connects the pixel electrode and the drain electrode.

* * * * *